(12) United States Patent
Parris et al.

(10) Patent No.: US 7,649,406 B2
(45) Date of Patent: Jan. 19, 2010

(54) SHORT-CIRCUIT CHARGE-SHARING TECHNIQUE FOR INTEGRATED CIRCUIT DEVICES

(75) Inventors: Michael C. Parris, Colorado Springs, CO (US); Kim C. Hardee, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 0 days.

(21) Appl. No.: 11/855,091

(22) Filed: Sep. 13, 2007

(65) Prior Publication Data
US 2009/0072879 A1 Mar. 19, 2009

(51) Int. Cl.
*G05F 3/02* (2006.01)
(52) U.S. Cl. .................................. 327/544; 327/546
(58) Field of Classification Search .................. None
See application file for complete search history.

(56) References Cited

U.S. PATENT DOCUMENTS

| | | | | |
|---|---|---|---|---|
| 5,450,027 | A | * | 9/1995 | Gabara ........................ 326/98 |
| 5,841,698 | A | * | 11/1998 | Hirano et al. .......... 365/185.21 |
| 6,115,316 | A | | 9/2000 | Mori et al. |
| 6,154,088 | A | * | 11/2000 | Chevallier et al. ........... 327/536 |
| 6,259,322 | B1 | | 7/2001 | Muza |
| 6,347,058 | B1 | | 2/2002 | Houghton et al. |
| 6,407,596 | B1 | * | 6/2002 | Taft et al. .................... 327/116 |
| 6,487,133 | B2 | | 11/2002 | Wada et al. |
| 6,754,122 | B2 | | 6/2004 | Wada et al. |
| 6,949,954 | B2 | | 9/2005 | Nystrom et al. |
| 6,985,019 | B1 | * | 1/2006 | Zhou et al. ................... 327/309 |
| 7,379,284 | B2 | * | 5/2008 | Fukushi et al. ................ 361/94 |
| 7,511,980 | B2 | * | 3/2009 | Arsovski et al. ............ 365/203 |
| 2005/0035958 | A1 | * | 2/2005 | Moon ........................ 345/204 |
| 2007/0040580 | A1 | | 2/2007 | Zanchi et al. |
| 2007/0279100 | A1 | | 12/2007 | Fallah et al. |

OTHER PUBLICATIONS

Yamauchi, Hiroyuki, Akamatsu, Hironori, Fujita, Tsutomu, An Asymptotically Zero Power Charge-Recycling Bus Architecture for Battery-Operated Ultrahigh Data Rate ULSI's, IEEE Journal of Solid-State Circuits, vol. 30, No. 4, Apr. 1995, pp. 423-431.
Rajapandian, Saravanan, Shepard, Kenneth L., Hazucha, Peter, Karnik, Tanay, High-Voltage Power Delivery Through Charge Recycling, IEEE Journal of Solid-State Circuits, vol. 41, No. 6, Jun. 2006, pp. 1400-1410.

* cited by examiner

*Primary Examiner*—Cassandra Cox
(74) *Attorney, Agent, or Firm*—Michael C. Martensen; William J. Kubida; Hogan & Hartson LLP

(57) ABSTRACT

A short-circuit charge-sharing technique which allows charge-sharing between two or more circuits with a simple shorting transistor controlled to achieve the desired operating voltage levels. The shorting transistor which can be either a P-channel Metal Oxide Semiconductor (PMOS) or an N-channel Metal Oxide Semiconductor (NMOS) device and can be controlled utilizing the same clock that enables the drive of the signals between which charge-sharing occurs. In operation, the desired operating voltage levels can be regulated by increasing and decreasing the pulse width of the control circuit output to the gate of the shorting transistor.

11 Claims, 5 Drawing Sheets

SHORT-CIRCUIT CHARGE-SHARING TECHNIQUE FOR INTEGRATED CIRCUIT DEVICES

CROSS REFERENCE TO RELATED PATENT APPLICATIONS

The present invention is related to the subject matter disclosed in U.S. patent applications Ser. No. 11/625,728, filed Jan. 22, 2007 for: "Switched Capacitor Charge-sharing Technique for Integrated Circuit Devices Enabling Signal Generation of Disparate Selected Signal Values" and Ser. No. 11/854,422, filed Sep. 12, 2007 for: "Data Bus Charge-Sharing Technique for Integrated Circuit Devices", the disclosures of which are herein specifically incorporated by this reference in their entirety.

BACKGROUND OF THE INVENTION

The present invention relates, in general, to the field of integrated circuit (IC) devices having a need to conserve operating power. More particularly, the present invention relates to a short-circuit charge-sharing technique operative to conserve integrated circuit device operating power.

Power consumption is becoming one of the largest concerns for today's integrated circuit devices. Charge-sharing, or charge recycling, is a circuit design technique being explored in the industry to lower the power on many IC products. Conventional approaches to charge-sharing involve placing two circuit blocks in series with each other between power and ground. Each of the circuits then operates at approximately half of the total power supply level with the current consumed by one circuit being approximately the same as that consumed by the second. In operation, the current used by this first circuit is recycled and re-used by the second. An example of this technique is shown in FIG. 1 of Rajapandian et al., "High-Voltage Power Delivery Through Charge Recycling", IEEE Journal of Solid-Sate Circuits, Vol. 41, No. 6, June 2006 at pg. 1401.

This conventional approach can be carried further to more than two circuits as is also shown in FIG. 2 of this same article wherein the various supply nodes are now labeled $3V_{DD}$, $2V_{DD}$ and $V_{DD}$ as three similar circuits are placed in series. There are at least two limitations with this approach, one of which is that the two circuit blocks may not be balanced to where the current $I_{TOP}$ is not similar to $I_{BOTTOM}$. This results in a drift of these internal power supply nodes and a shift in their levels depending on the amount of time each circuit is active. This can be overcome with a regulator and hold circuit however, efficiency of the charge-sharing operation quickly decreases with this current imbalance.

Another limitation of this technique exists when something other than an equal fraction of the supply voltage is desired to supply voltage for the circuit blocks. This can occur when the lower, or reference, voltage for one circuit block is not desired to become the supply voltage of the second circuit block.

SUMMARY OF THE INVENTION

The short-circuit charge-sharing technique of the present invention allows charge-sharing between two or more circuits with a simple shorting transistor controlled to achieve the desired operating voltage levels. The shorting transistor which can be either a P-channel Metal Oxide Semiconductor (PMOS) or an N-channel Metal Oxide Semiconductor (NMOS) device and can be controlled utilizing the same clock that enables the drive of the signals between which charge-sharing occurs.

In an IC incorporating a memory array for example, if two sets of read data lines in a read pipeline stage path are to be charge shared with each other, the read clock (commonly labeled RCLK) that is used to time the first and second set of read data lines can also be used to generate the gate voltage of the charge-sharing shorting device. This allows for easy enabling and disabling of the charge-sharing circuits. Also, by using the same clock signal, or a signal of the same clock frequency as that activating the signal lines that are to be charge-shared, automatic tracking will occur between the amount of charge needed and the amount of charge that is shared.

Particularly disclosed herein is a charge-sharing technique between first and second signal lines which comprises: sensing a voltage level on the first signal line increasing above a first determined voltage level; coupling the first signal line to the second signal line for a first time period to reduce the sensed voltage level toward the first determined voltage level; alternatively sensing the voltage level on the first signal line decreasing below the first determined voltage level; and coupling the first signal line to the second signal line for a second time period shorter than the first time period to allow the sensed voltage level to increase toward the first determined voltage level.

In a particular embodiment disclosed herein the technique may further comprise: further sensing a voltage level on the second signal line increasing above a second determined voltage level; further coupling the second signal line to the first signal line for a third time period to reduce the sensed voltage level toward the second determined voltage level; further alternatively sensing the voltage level on the second signal line decreasing below the first determined voltage level; and further coupling the second signal line to the first signal line for a fourth time period greater than the third time period to allow the sensed voltage level to increase toward the second determined voltage level.

Also particularly disclosed herein is a circuit for charge-sharing between first and second signal lines which comprises: a control circuit receiving a clock input signal and providing a gating signal output and a switching device coupled between the first and second signal lines and having a control terminal coupled to receive the gating signal output of the control circuit. In a particular embodiment, the duration of the gating signal is effectively increased to reduce a sensed voltage level on the first signal line and increase a sensed voltage level on the second signal line or decreased to increase a sensed voltage on the first signal line and to decrease a sensed voltage level on the second signal line.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1A:
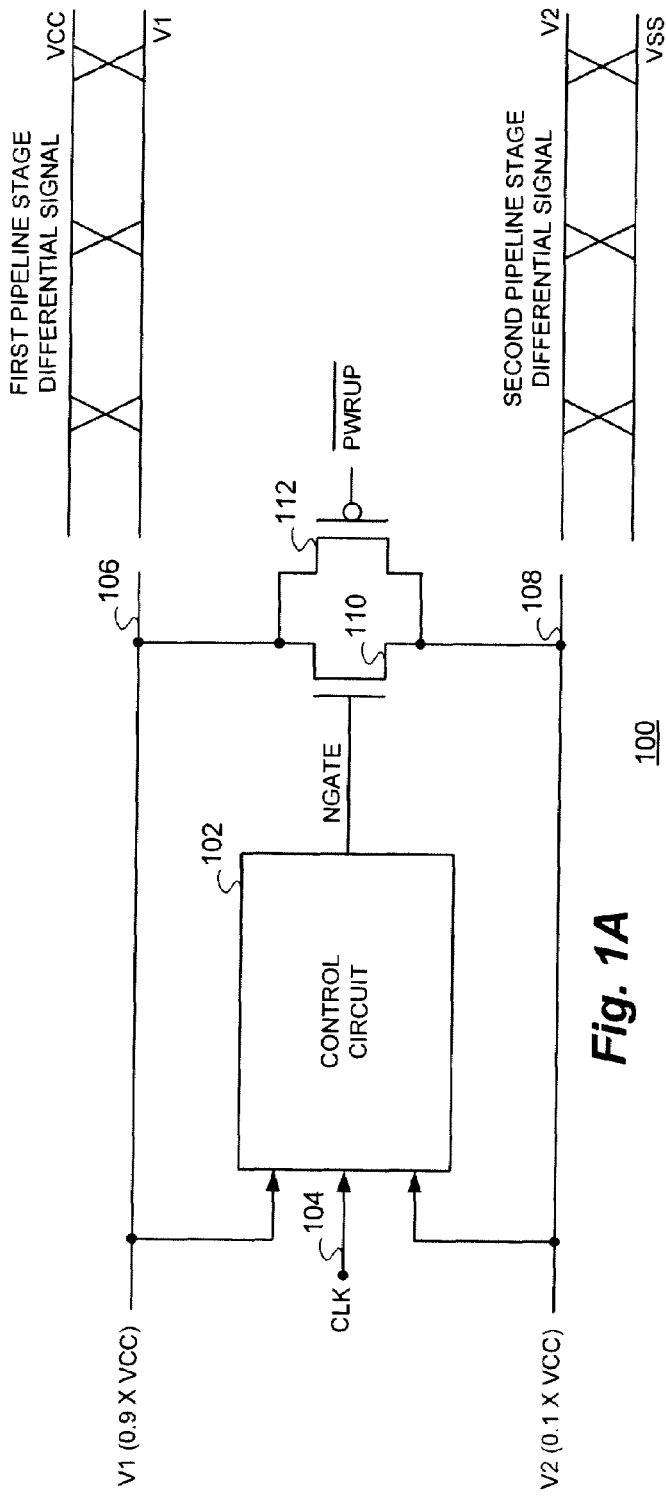
FIG. 1A is a functional block diagram of a representative circuit implementation of the short-circuit charge-sharing technique of the present invention.

With reference now to FIG. 1A, a functional block diagram of a representative circuit 100 implementation of the short-circuit charge-sharing technique of the present invention is shown. The circuit 100 receives a voltage level V1, which in the exemplary implementation shown is substantially equal to 0.9×VCC and a voltage level V2 substantially equal to 0.1× VCC.

The V1 and V2 voltage levels are supplied on lines 106 and 108 as inputs to a control circuit 102. An exemplary implementation of the control circuit 102 will be described more fully hereinafter. The control circuit 102 also receives a clock (CLK) signal input on line 104 and is operational to provide a gating signal to the control terminal of transistor 110 which is coupled between lines 106 and 108. In the representative embodiment of a circuit 100 in accordance with the technique of the present invention illustrated, transistor 110 is illustrated as an N-channel device. Transistor 112 is illustrated as a P-channel device in this exemplary embodiment and it is coupled in parallel to transistor 110 to receive the /PWRUP signal at its gate terminal.

In operation, if the gate of transistor 110 is constantly "on", then V1 and V2 will become equal and near VCC/2 (as in the conventional approach previously described) if the capacitances on the signal lines 106 and 108 are similar. What is desired is a smaller swing on signal lines 106 and 108 and a way to charge share between the two nodes V1 and V2. By using an adjustable width one shot generator in the form of the control circuit 102 the level of V1 and V2 can be made smaller and controlled.

Figure 1B:
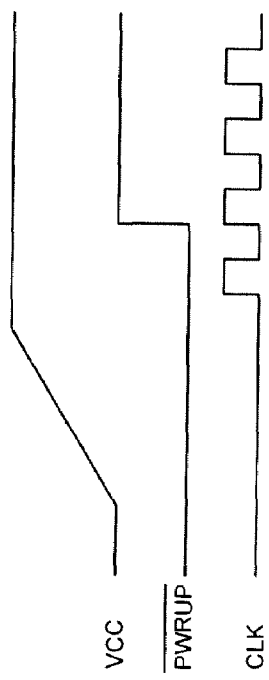
FIG. 1B is a set of waveforms to accompany the circuit of the preceding figure illustrating the interrelationship among the supply voltage (VCC), clock (CLK) and power-up bar (/PWRUP) signals.

With reference additionally now to FIG. 1B, a set of waveforms is illustrated to accompany the circuit of the preceding figure and showing the interrelationship among the supply voltage (VCC), clock (CLK) and power-up bar (/PWRUP) signals. In operation, the /PWRUP signal can be generated on-chip or supplied off-chip as desired and it remains "low" until VCC is up to a specified level, stable and the clock has to started to run at the appropriate frequency.

Figure 2:
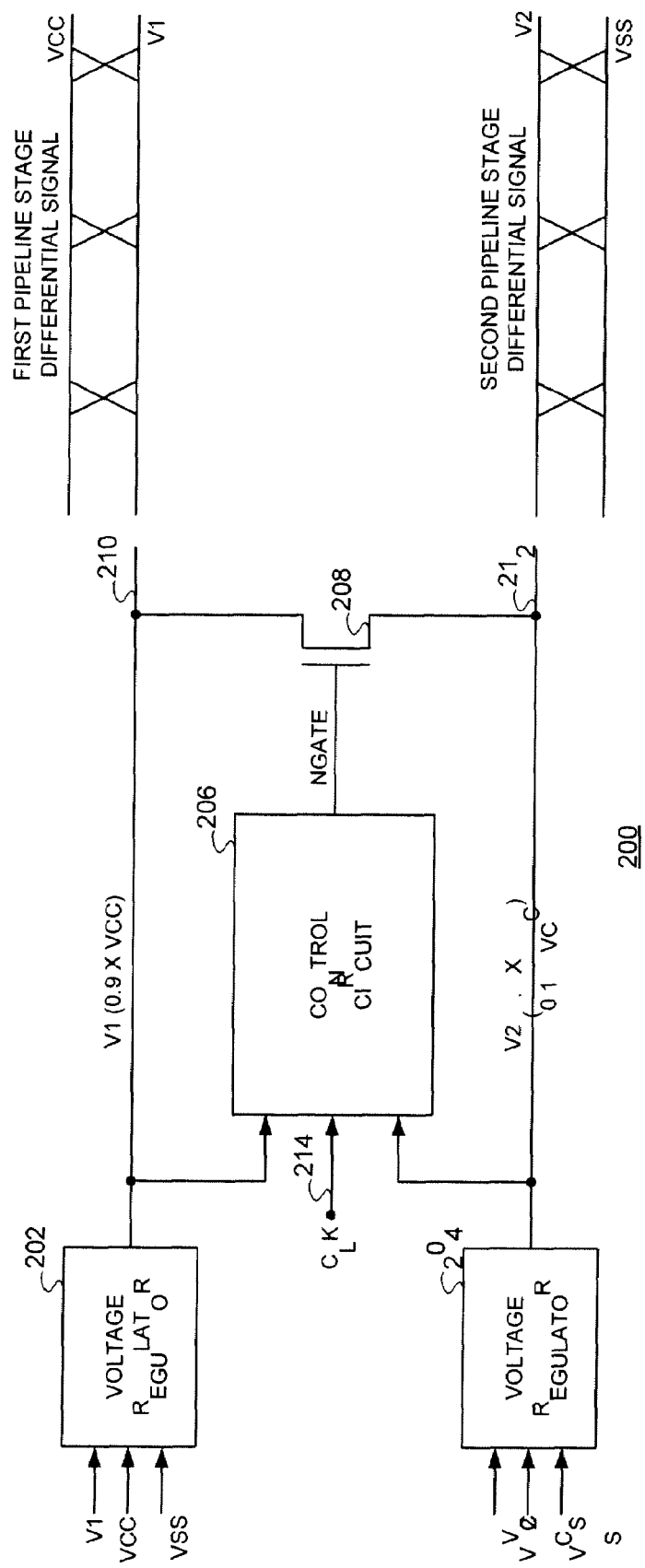
FIG. 2 is another functional block diagram of a representative circuit implementation of the short-circuit charge-sharing technique of the present invention.

With reference additionally now to FIG. 2, a functional block diagram of another representative circuit 200 implementation of the short-circuit charge-sharing technique of the present invention is shown. The circuit 200 comprises, in pertinent part, a pair of voltage regulators 202 and 204. Voltage regulator 202 receives as inputs a supply voltage level (VCC), a reference voltage level (VSS) and a voltage level V1, which in the exemplary implementation shown is equal to 0.9×VCC. Similarly, the voltage regulator 204 also receives as inputs VCC, VSS and a voltage level V2, which in the exemplary implementation shown is equal to 0.1×VCC.

The V1 and V2 outputs of the voltage regulators 202 and 204 respectively are supplied on lines 210 and 212 as inputs to a control circuit 206. The control circuit 206 will be described more fully hereinafter. The control circuit 206 also receives a clock (CLK) signal input on line 214 and is operational to provide a gating signal to the control terminal of transistor 208 which is coupled between lines 210 and 212. In the representative embodiment of a circuit 200 in accordance with the technique of the present invention illustrated, transistor 208 is illustrated as an N-channel device.

In operation, the voltage regulators 202, 204 serve to hold the V1 and V2 levels during periods of charge usage imbalance and during "inactive" or "standby" periods when leakage currents may alter the V1 and V2 voltage levels. If the gate of transistor 208 is constantly "on, then V1 and V2 will become equal and near VCC/2 (as in the conventional approach previously described) if the capacitances on the signal lines 210 and 212 are similar. What is desired is a smaller swing on signal lines 210 and 212 and a way to charge share between the two nodes V1 and V2. By using an adjustable width one shot generator in the form of the control circuit 206 the level of V1 and V2 can be made smaller and controlled.

In order to recycle more charge, the regulated levels of V1 and V2 in voltage regulators 202 and 204 can be set to be more relaxed than of the control circuit 206. The voltage regulators 202 and 204 may be configured to hold V1 and V2 to proper levels during power-up conditions or idle times (e.g. power-down or self-refresh modes) when the CLK signal may not be running or may be running too slowly.

Figure 3:
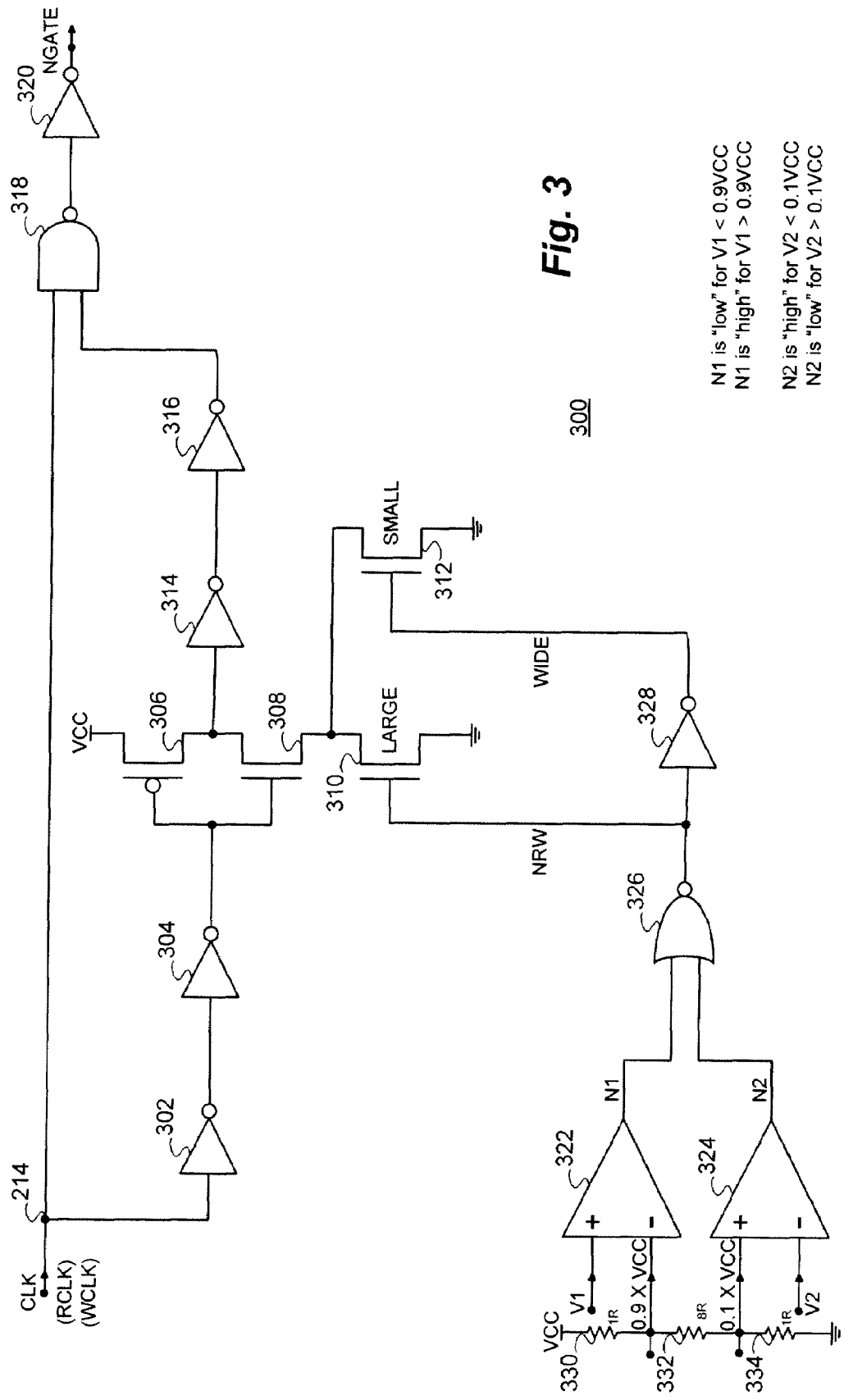
FIG. 3 is a more detailed schematic illustration of the control circuit of the preceding FIGS. 1A and 2.

With reference additionally now to FIG. 3, a more detailed schematic illustration of the control circuit 206 of the preceding figure (and control circuit 102 of FIG. 1A) is shown, herein labeled as circuit 300. The circuit 300 receives the CLK signal on line 114 which is inverted through series coupled inverters 302, 304 for application to the common coupled gate terminals of P-channel transistor 306 and N-channel transistor 308.

Transistors 306 and 308 are coupled in series with a relatively large N-channel transistor 310 between VCC and circuit ground (VSS). The common connected drain terminals of transistors 306 and 308 define an input to another pair of series coupled inverters 314 and 316, the output of which is supplied as one input to a two-input NAND gate 318. The CLK signal on line 214 provides the other input to the NAND gate 318. Output of the NAND gate 318 is inverted through inverter 320 to supply an NGATE signal to the control terminal of transistor 208 (FIG. 2).

The control circuit 300 further comprises a pair of comparators 322 and 324. Comparator 322 receives the voltage level V1 and 0.9×VCC at its inputs to produce an output signal designated as N1. In like manner, comparator 324 receives the voltage level V2 and 0.1×VCC at its inputs to produce an output signal designated as N2. A resistor/divider circuit comprising series connected resistors 330, 332 and 334 (having, for example, representative values of 1R, 8R and 1R respectively) or similar reference voltage establishing techniques known in the art may be used to generate the 0.9×VCC and 0.1×VCC levels within the circuit 300.

The N1 and N2 signals are provided as inputs to a two-input NOR gate 326 whose output is supplied to the gate terminal of transistor 310 on line NRW (narrow) as well as to the input of an inverter 328. Output of the inverter 328 is supplied to the gate terminal of a relatively small N-channel transistor 312 coupled in parallel to the relatively large transistor 310. The output of the inverter 328 defines a WIDE line input to transistor 312.

The short-circuit charge-sharing technique of the present invention may be advantageously utilized in an integrated circuit device incorporating a memory array, for example, where two sets of internal differential read lines are pipelined in two stages; one operating between VCC and 0.9×VCC (e.g. VCC and VCC−100 mV) and the other is generated between 0.1×VCC and VSS (e.g. 100 mV and ground). In this particular application, the CLK signal on line 214 may be the memory array read clock (RCLK) which toggles during read cycles and the relatively small and large transistors 312 and 310 respectively (e.g. having correspondingly small and large channel widths) are controlled by the signals WIDE and NRW respectively. The WIDE and NRW signals are generated by the comparators 322 and 324.

In operation, the voltage levels V1 and V2 can be regulated by increasing and decreasing the pulse width of the control circuit 300 output signal NGATE. The control circuit 300 functions effectively as a one shot generator triggered off the rising edge of an internal clock signal. The levels of V1 and V2 are used as inputs to the comparators 322 and 324 and logic gates that then determine if the shorting transistor (transistor 110 of FIG. 1A or 208 of FIG. 2) needs to remain actively on for a longer period of time or a shorter period of time.

When the voltage level of V1 drifts too far above its target level towards VCC, the comparators 322, 324 sense that more time is needed to short V1 (line 106, FIG. 1A or line 210, FIG. 2) and V2 (line 108, FIG. 1A of line 212, FIG. 2) together so that V1 will be pulled lower. In this case the pulse width of the signal NGATE at the output of inverter 320 is made wider by using the relatively weak, small transistor 312 in the center inverter of the inverter chain in the one shot generator. Further, if V1 drifts too far below its target level, the comparators 322, 324 will detect this as well and turn on the larger transistor 310 in the center inverter of the inverter chain resulting in a narrower NGATE pulse width and less time for V1 to be shorted to V2. The same monitoring is done on V2 to also provide control of the NGATE pulse width.

Figure 4:
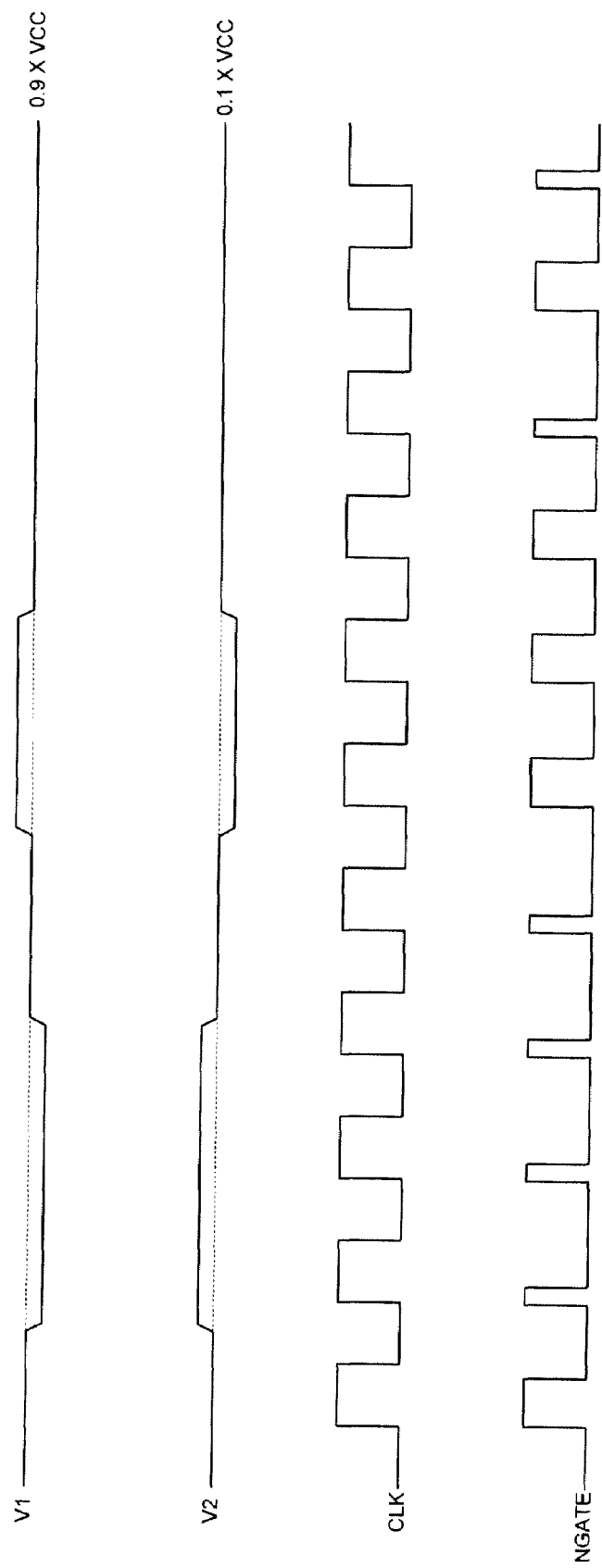
FIG. 4 is a set of waveforms to accompany and illustrate the operation of the circuits of FIGS. 2 and 3.

With reference additionally now to FIG. 4, a set of waveforms is shown to accompany the circuits of FIGS. 2 and 3 and further illustrate their operation with respect to the representative voltage levels V1 and V2, clock signal (CLK) the resultant pulse width modulated NGATE signal. It should be noted that although the pulse width of the NGATE signal is described and illustrated as being made relatively wide or narrow, it can also be configured to provide a continuum of variable pulse widths. In the representative embodiment shown, the voltage levels V1 and V2 can be a ratio of VCC as shown (e.g. 0.9×VCC and 0.1×VCC) or absolute levels such as 900 mV and 100 mV.

Figure 5:
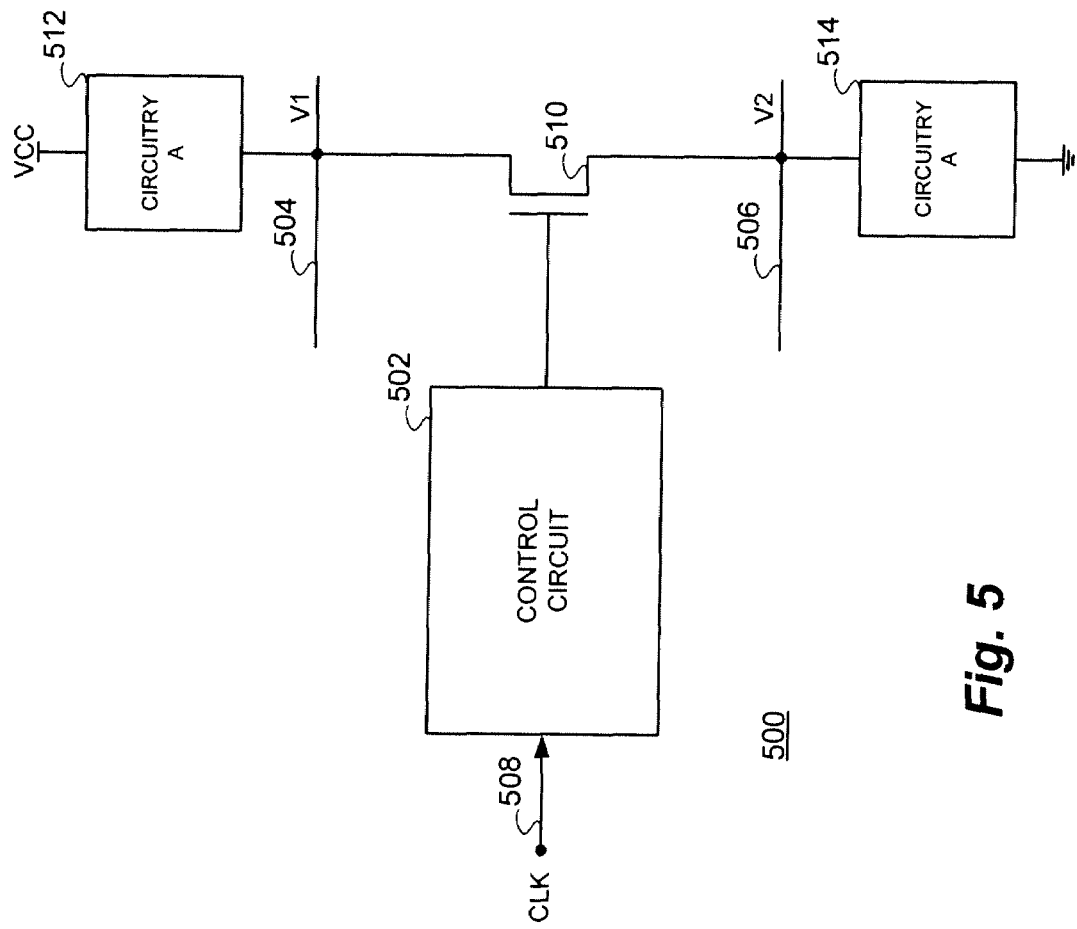
FIG. 5 is a high level functional block diagram of a more generalized implementation of the technique of the present invention.

With reference additionally now to FIG. 5, a high level functional block diagram of a more generalized circuit 500 implementation of the technique of the present invention. The circuit 500 illustrated is useful in understanding the basic principles of the short-circuit charge-sharing technique of the present invention.

Fundamentally, the circuit 500 comprises a control circuit 502 which may be implemented in a manner similar to the control circuit 300 of the FIG. 3. The control circuit 502 provides a gating signal to the control terminal of a transistor (by way of example only, an N-channel transistor) 510 in response to an input CLK signal on line 508. The transistor 510 is coupled between a V1 line 504 and a V2 line 506 as shown. As also shown, a desired circuit (illustrated as circuitry A 512) may be coupled between VCC and the V1 line 504 while another circuit (illustrated as circuitry B 514) may be coupled between VSS and the V2 line 506. The short-circuit charge-sharing technique of the present invention may be advantageously utilized in conjunction with signals that are differential such as "true" and "complement" signals. It may also be used in conjunction with a two or more stage pipeline design so that if the first set of signals are "active" then the second set is "active" too, or at least will be "active" one clock cycle later.

While there have been described above the principles of the present invention in conjunction with a specific circuit implementation it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. A charge-sharing technique between first and second signal lines comprising:
    sensing a voltage level on said first signal line increasing above a first determined voltage level;
    coupling said first signal line to said second signal line for a first time period to reduce said sensed voltage level toward said first determined voltage level;
    alternatively sensing said voltage level on said first signal line decreasing below said first determined voltage level; and
    coupling said first signal line to said second signal line for a second time period shorter than said first time period to allow said sensed voltage level to increase toward said first determined voltage level.

2. The technique of claim 1 wherein said first determined voltage level is a fraction of a supply voltage level.

3. The technique of claim 1 wherein said steps of sensing and alternatively sensing are carried out by:
    comparing said first determined voltage level to a supply voltage level.

4. The technique of claim 1 further comprising:
    further sensing a voltage level on said second signal line increasing above a second determined voltage level;
    further coupling said second signal line to said first signal line for a third time period to reduce said sensed voltage level toward said second determined voltage level;

further alternatively sensing said voltage level on said second signal line decreasing below said first determined voltage level; and further coupling said second signal line to said first signal line for a fourth time period greater than said third time period to allow said sensed voltage level to increase toward said second determined voltage level.

5. The technique of claim 4 wherein said second determined voltage level is a fraction of a supply voltage level.

6. The technique of claim 4 wherein said steps of further sensing and further alternatively sensing are carried out by:
further comparing said second determined voltage level to a supply voltage level.

7. A circuit for charge-sharing between first and second signal lines comprising:
a control circuit receiving a clock input signal and providing a gating signal output wherein said control circuit includes a first comparator for comparing a voltage level on said first signal line to a determined first voltage level wherein a duration of said gating signal is increased to reduce a sensed voltage level on said first signal line and increase a sensed voltage level on said second signal line; and
a switching device coupled between said first and second signal lines and having a control terminal coupled to receive said gating signal output of said control circuit.

8. A circuit for charge-sharing between first and second signal lines comprising:
a control circuit receiving a clock input signal and providing a gating signal output wherein said control circuit includes a first comparator for comparing a voltage level on said first signal line to a determined first voltage level wherein said gating signal is pulse width modulated and wherein a duration of said gating signal is decreased to increase a sensed voltage on said first signal line and to decrease a sensed voltage level on said second signal line; and
a switching device coupled between said first and second signal lines and having a control terminal coupled to receive said gating signal output of said control circuit.

9. A circuit for charge-sharing between first and second signal lines comprising:
a control circuit receiving a clock input signal and providing a gating signal output wherein said control circuit includes a first comparator for comparing a voltage level on said first signal line to a determined first voltage level;
a switching device coupled between said first and second signal lines and having a control terminal coupled to receive said gating signal output of said control circuit; and
a second comparator for comparing a voltage level on said second signal line to a determined second voltage level.

10. A circuit for charge-sharing between first and second signal lines comprising:
a control circuit receiving a clock input signal and providing a gating signal output wherein said control circuit includes a first comparator for comparing a voltage level on said first signal line to a determined first voltage level;
a switching device coupled between said first and second signal lines and having a control terminal coupled to receive said gating signal output of said control circuit; and
a second comparator for comparing a voltage level on said second signal line to a determined second voltage level wherein said control circuit is operative to decrease a duration of said gating signal when said voltage level on said second signal line rises above said determined second voltage level and increase a duration of said gating signal when said voltage level on said second signal line falls below said determined second voltage level.

11. A circuit for charge-sharing between first and second signal lines comprising:
a control circuit receiving a clock input signal and providing a gating signal output wherein said control circuit includes a first comparator for comparing a voltage level on said first signal line to a determined first voltage level;
a switching device coupled between said first and second signal lines and having a control terminal coupled to receive said gating signal output of said control circuit;
a second comparator for comparing a voltage level on said second signal line to a determined second voltage level;
a first transistor having a relatively small channel width; and
a second transistor having a relatively large channel width;
said first transistor being operative to increase a width of said gating signal and said second transistor being operative to decrease a width of said gating signal.

* * * * *